United States Patent
Kyono et al.

(10) Patent No.: US 8,071,986 B2
(45) Date of Patent: Dec. 6, 2011

(54) NITRIDE SEMICONDUCTOR LIGHT-EMITTING ELEMENT

(75) Inventors: Takashi Kyono, Itami (JP); Katsushi Akita, Itami (JP); Hideki Hirayama, Wako (JP)

(73) Assignees: Sumitomo Electric Industries, Ltd., Osaka (JP); Riken, Saitama (JP)

( * ) Notice: Subject to any disclaimer, the term of this patent is extended or adjusted under 35 U.S.C. 154(b) by 82 days.

(21) Appl. No.: 11/659,002

(22) PCT Filed: Apr. 25, 2006

(86) PCT No.: PCT/JP2006/308640
§ 371 (c)(1),
(2), (4) Date: Jan. 31, 2007

(87) PCT Pub. No.: WO2006/126362
PCT Pub. Date: Nov. 30, 2006

(65) Prior Publication Data
US 2009/0026440 A1    Jan. 29, 2009

(30) Foreign Application Priority Data
May 26, 2005 (JP) ................................ P2005-154416

(51) Int. Cl.
*H01L 27/15* (2006.01)
(52) U.S. Cl. .................................. 257/79; 257/E21.126
(58) Field of Classification Search .................... 257/79, 257/E21.126, 13
See application file for complete search history.

(56) References Cited

U.S. PATENT DOCUMENTS
2004/0051107 A1 * 3/2004 Nagahama et al. ............. 257/79

FOREIGN PATENT DOCUMENTS
JP    2003-115642    4/2003
JP    2004-6957      1/2004

OTHER PUBLICATIONS

International Preliminary Report on Patentability and Written Opinion of The International Searching Authority issued in International Application No. PCT/JP2006/308640, dated Dec. 13, 2007.
Chinese Office Action issued in Patent Application No. 200680000584.6 dated on Jun. 27, 2008.

* cited by examiner

*Primary Examiner* — Hung Vu
(74) *Attorney, Agent, or Firm* — McDermott Will & Emery LLP

(57) ABSTRACT

A nitride semiconductor light-emitting element 11 is one for generating light containing a wavelength component in an ultraviolet region. The nitride semiconductor light-emitting element 11 has an active region 17 including $In_{X1}Al_{Y1}Ga_{1-X1-Y1}N$ well layers 13 ($1>X1>0$ and $1>Y1>0$) and $In_{X2}Al_{Y2}Ga_{1-X2-Y2}N$ barrier layers 15 ($1>X2>0$ and $1>Y2>0$). An energy gap difference Eg1 between the $In_{X1}Al_{Y1}Ga_{1-X1-Y1}N$ well layers 13 and the $In_{X2}Al_{Y2}Ga_{1-X2-Y2}N$ barrier layers 15 is not less than $2.4 \times 10^{-20}$ J nor more than $4.8 \times 10^{-20}$ J.

4 Claims, 11 Drawing Sheets

*Fig.4*

|  | y | Eg1(E(b)-E(w)) |
|---|---|---|
| COMPARATIVE EXAMPLE 1 | 0.15 | $2.1 \times 10^{-20}$ J(0.13eV) |
| EXAMPLE 1 | 0.19 | $3.5 \times 10^{-20}$ J(0.22eV) |
| COMPARATIVE EXAMPLE 2 | 0.26 | $5.3 \times 10^{-20}$ J(0.33eV) |

*Fig.8*

|  | z | Eg2(E(bl)-E(w)) |
|---|---|---|
| EXAMPLE 3 | 0.18 | $3.7 \times 10^{-20}$ J(0.23eV) |
| EXAMPLE 4 | 0.24 | $5.3 \times 10^{-20}$ J(0.33eV) |
| EXAMPLE 5 | 0.27 | $6.4 \times 10^{-20}$ J(0.40eV) |
| EXAMPLE 6 | 0.30 | $7.4 \times 10^{-20}$ J(0.46eV) | ical
NITRIDE SEMICONDUCTOR LIGHT-EMITTING ELEMENT

RELATED APPLICATIONS

This application is a national phase of PCT/JP2006/308640 filed Apr. 25, 2006, which claims priority from Japanese Application No. 2005-154416 filed May 26, 2005, the disclosures of which Applications are incorporated by reference herein. The benefit of the filing and priority dates of the International and Japanese Applications is respectfully requested.

TECHNICAL FIELD

The present invention relates to a nitride semiconductor light-emitting element.

BACKGROUND ART

Patent Document 1 describes an LED having an active layer of a quantum well structure consisting of AlGaN. In this LED, a difference between an Al composition of barrier layers and an Al composition of quantum well layers in the quantum well structure is within 15% and the Al composition of the quantum well layers is not less than 2%.
Patent Document 1: Japanese Patent Application Laid-Open No. 2004-6957

DISCLOSURE OF THE INVENTION

Problem to be Solved by the Invention

Incidentally, a nitride semiconductor light-emitting element having a quantum well structure comprising of InGaN well layers and InGaN barrier layers (InGaN-QW) is able to generate light of a desired wavelength in the range from violet to green through adjustment of the In composition of the InGaN well layers. The In composition of the InGaN barrier layers is set to a small value in order to prevent degradation of crystal quality. Alternatively, GaN barrier layers may be used instead of the InGaN barrier layers. Therefore, only values in a very narrow range are available for the In composition of the InGaN barrier layers.

Consequently, the energy gap difference between the InGaN well layers and the InGaN barrier layers is substantially determined by adjustment of the In composition of the InGaN well layers. For this reason, there is no room for selection of the value of the energy gap difference in InGaN-QW.

On the other hand, in the nitride semiconductor light-emitting element having the quantum well structure comprising of AlGaN well layers and AlGaN barrier layers (AlGaN-QW), the value of the energy gap difference between the AlGaN well layers and the AlGaN barrier layers can also be controlled by adjusting the Al composition of the AlGaN barrier layers as well as by adjusting the Al composition of the AlGaN well layers.

However, if the Al composition of the AlGaN barrier layers is too large, the carrier confinement effect will be enhanced, while a piezoelectric field in the AlGaN well layers will become so strong as to spatially separate injected electrons and holes, which will result in failure in increase in luminous efficiency of the nitride semiconductor light-emitting element.

On the other hand, it is speculated according to Inventors' expertise that the influence of the piezoelectric field is not so significant in a nitride semiconductor light-emitting element having a quantum well structure comprising of InAlGaN well layers and InAlGaN barrier layers (InAlGaN-QW). It can thus be contemplated for this reason that the Al composition of the InAlGaN barrier layers can be increased in order to enhance the carrier confinement effect. It was, however, discovered by Inventors' experiment that when the Al composition of the InAlGaN barrier layers was set to be too large, it resulted in degrading the crystal quality of the InAlGaN barrier layers and thus decreasing the luminous efficiency of the nitride semiconductor light-emitting element.

The present invention has been accomplished in view of the above-described respects and an object of the invention is to provide a nitride semiconductor light-emitting element improved in luminous efficiency.

Means for Solving the Problem

In order to solve the above problem, a nitride semiconductor light-emitting element of the present invention is a nitride semiconductor light-emitting element for generating light containing a wavelength component in an ultraviolet region, comprising an active region comprising an $In_{X1}Al_{Y1}Ga_{1-X1-Y1}N$ well layer (1>X1>0 and 1>Y1>0) and an $In_{X2}Al_{Y2}Ga_{1-X2-Y2}N$ barrier layer (1>X2>0 and 1>Y2>0), wherein an energy gap difference between the $In_{X1}Al_{Y1}Ga_{1-X1-Y1}N$ well layer and the $In_{X2}Al_{Y2}Ga_{1-X2-Y2}N$ barrier layer is not less than $2.4 \times 10^{-20}$ J nor more than $4.8 \times 10^{-20}$ J.

Since in the nitride semiconductor light-emitting element of the present invention the energy gap difference between the well layer and the barrier layer (hereinafter referred to as "first energy gap difference") is not less than $2.4 \times 10^{-20}$ J, the active region demonstrates exceptionally good carrier confinement effect.

When the bandgap energy of the well layer is set at a certain value, the bandgap energy of the barrier layer needs to be increased in order to increase the first energy gap difference. In order to increase the bandgap energy of the barrier layer, it is necessary to increase the Al composition Y2 of the barrier layer. However, if the Al composition Y2 of the barrier layer is too large, the crystal quality of the barrier layer will tend to degrade. Therefore, when the first energy gap difference is too large, the crystal quality of the barrier layer tends to degrade. Since in the nitride semiconductor light-emitting element of the present invention the first energy gap difference is not more than $4.8 \times 10^{-20}$ J, the barrier layer has exceptionally good crystal quality.

The above confirms that the nitride semiconductor light-emitting element is able to achieve an outstanding improvement in the luminous efficiency of the nitride semiconductor light-emitting element. The nitride semiconductor light-emitting element is preferably configured as follows: it further comprises an $In_{X3}Al_{Y3}Ga_{1-X3-Y3}N$ layer (1>X3≧0 and 1>Y3>0) provided on the active region; an energy gap difference between the $In_{X3}Al_{Y3}Ga_{1-X3-Y3}N$ layer and the $In_{X1}Al_{Y1}Ga_{1-X1-Y1}N$ well layer is larger than the energy gap difference between the $In_{X1}Al_{Y1}Ga_{1-X1-Y1}N$ well layer and the $In_{X2}Al_{Y2}Ga_{1-X2-Y2}N$ barrier layer; the energy gap difference between the $In_{X3}Al_{Y3}Ga_{1-X3-Y3}N$ layer and the $In_{X1}Al_{Y1}Ga_{1-X1-Y1}N$ well layer is not more than $7.2 \times 10^{-20}$ J.

In this nitride semiconductor light-emitting element, the energy gap difference between the $In_{X3}Al_{Y3}Ga_{1-X3-Y3}N$ layer and the well layer (referred to hereinafter as "second energy gap difference") is larger than the aforementioned first energy gap difference, and it is thus feasible to prevent overflow of carriers.

When the bandgap energy of the well layer is set at a certain value, the bandgap energy of the $In_{X3}Al_{Y3}Ga_{1-X3-Y3}N$ layer needs to be increased in order to increase the second energy gap difference. In order to increase the bandgap energy of the $In_{X3}Al_{Y3}Ga_{1-X3-Y3}N$ layer, it is necessary to increase the Al composition Y3 of the $In_{X3}Al_{Y3}Ga_{1-X3-Y3}N$ layer. However, if the Al composition Y3 is too large, the crystal quality of the $In_{X3}Al_{Y3}Ga_{1-X3-Y3}N$ layer will tend to degrade. Therefore, when the second energy gap difference is too large, the crystal quality of the $In_{X3}Al_{Y3}Ga_{1-X3-Y3}N$ layer tends to degrade. Since in this nitride semiconductor light-emitting element the second energy gap difference is not more than $7.2 \times 10^{-20}$ J, the $In_{X3}Al_{Y3}Ga_{1-X3-Y3}N$ layer has exceptionally good crystal quality.

Preferably, a thickness of the $In_{X3}Al_{Y3}Ga_{1-X3-Y3}N$ layer is not less than 10 nm, and the thickness of the $In_{X3}Al_{Y3}Ga_{1-X3-Y3}$ N layer is not more than 30 nm. In this nitride semiconductor light-emitting element, the thickness of the $In_{X3}Al_{Y3}Ga_{1-X3-Y3}N$ layer is not less than 10 nm, and it is thus feasible to prevent overflow of carriers. If the thickness of the $In_{X3}Al_{Y3}Ga_{1-X3-Y3}N$ layer is too large, the crystal quality will tend to degrade. Since in this nitride semiconductor light-emitting element the thickness of the $In_{X3}Al_{Y3}Ga_{1-X3-Y3}N$ layer is not more than 30 nm, the crystal quality is exceptionally good. Therefore, an improvement can be made in the luminous efficiency of the nitride semiconductor light-emitting element.

Preferably, an In composition X1 of the $In_{X1}Al_{Y1}Ga_{1-X1-Y1}N$ well layer is more than 0 and less than 0.03. At a certain emission wavelength, an increase in the In composition X1 requires an increase in the Al composition Y1 for adjustment of wavelength. If the Al composition Y1 is too large, the crystal quality of the well layer will tend to degrade. It is thus preferable to set the In composition X1 at a small value, in order to improve the crystal quality of the well layer. Since in the nitride semiconductor light-emitting element the In composition X1 of the well layer is less than 0.03, the well layer has excellent crystal quality. For this reason, an improvement can be made in the luminous efficiency of the nitride semiconductor light-emitting element.

Preferably, an In composition X2 of the $In_{X2}Al_{Y2}Ga_{1-X2-Y2}N$ barrier layer is more than 0 and less than 0.03. At a certain emission wavelength, an increase in the In composition X2 requires an increase in the Al composition Y2 for adjustment of wavelength. If the Al composition Y2 is too large, the crystal quality of the barrier layer will tend to degrade. Therefore, it is preferable to set the In composition X2 at a small value, in order to improve the crystal quality of the barrier layer. Since in the nitride semiconductor light-emitting element the In composition X2 of the barrier layer is less than 0.03, the barrier layer has excellent crystal quality. For this reason, an improvement can be made in the luminous efficiency of the nitride semiconductor light-emitting element.

Preferably, the active region has a quantum well structure configured to generate light of a wavelength in a wavelength region of not less than 300 nm nor more than 365 nm. This nitride semiconductor light-emitting element is able to generate light showing an emission spectrum having a peak wavelength in the wavelength region of not less than 300 nm nor more than 365 nm.

Effect of the Invention

The present invention provides the nitride semiconductor light-emitting element improved in the luminous efficiency.

BRIEF DESCRIPTION OF THE DRAWINGS

FIG. 4 is a drawing showing energy gap differences of nitride semiconductor light-emitting elements of Example 1, Comparative Example 1, and Comparative Example 2.

FIG. 8 is a drawing showing energy gap differences of nitride semiconductor light-emitting elements of Example 3, Example 4, Example 5, and Example 6.

DESCRIPTION OF REFERENCE SYMBOLS 11, 11a: nitride semiconductor light-emitting element; 13: $In_{X1}Al_{Y1}Ga_{1-X1-Y1}N$ well layers; 15: $In_{X2}Al_{Y2}Ga_{1-X2-Y2}N$ barrier layers; 17: active region; 29: $In_{X3}Al_{Y3}Ga_{1-X3-Y3}N$ layer.

BEST MODES FOR CARRYING OUT THE INVENTION

Embodiments of the present invention will be described below in detail with reference to the accompanying drawings. In the description of the drawings, identical or equivalent elements will be denoted by the same reference symbols, without redundant description.

First Embodiment

Figure 1:
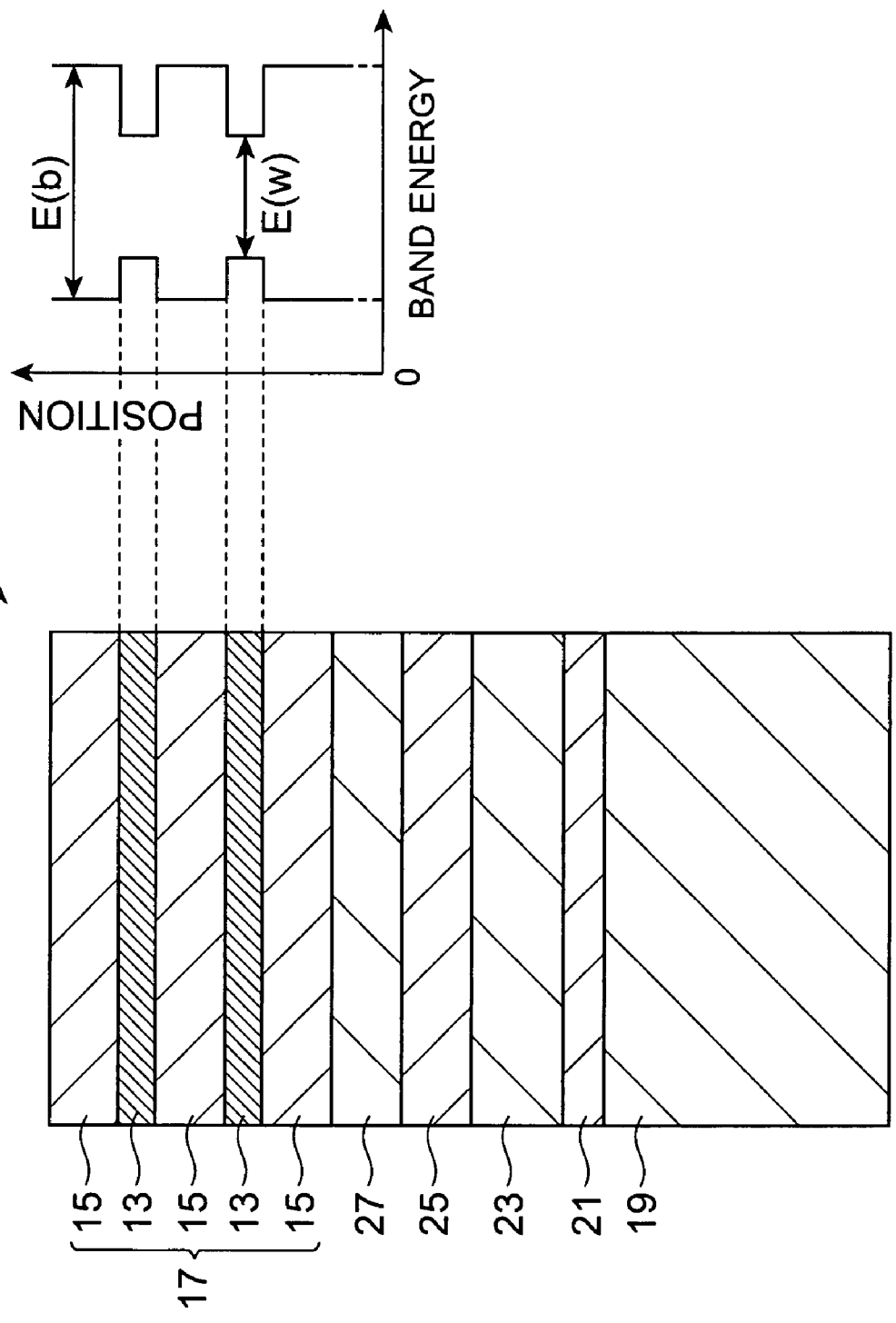
FIG. 1 is a sectional view schematically showing a nitride semiconductor light-emitting element according to a first embodiment.

FIG. 1 is a sectional view schematically showing a nitride semiconductor light-emitting element according to the first embodiment. FIG. 1 also shows a band diagram of the nitride semiconductor light-emitting element according to the first embodiment. The nitride semiconductor light-emitting element 11 shown in FIG. 1 is excited, for example, by light such as laser light, to generate light containing wavelength components in the ultraviolet region. The nitride semiconductor light-emitting element 11 has an active region 17 comprising of InAlGaN semiconductors.

The active region 17 includes $In_{X1}Al_{Y1}Ga_{1-X1-Y1}N$ well layers 13 (hereinafter referred to as "well layers 13") and $In_{X2}Al_{Y2}Ga_{1-X2-Y2}N$ barrier layers 15 (hereinafter referred to as "barrier layers 15"). Here the In compositions X1, X2 and Al compositions Y1, Y2 satisfy the following conditions: $1>X1>0$, $1>Y1>0$, $1>X2>0$, and $1>Y2>0$. The In compositions X1, X2 and Al compositions Y1, Y2 are adjusted when the well layers 13 and barrier layers 15 are formed; for example, when they are formed by metal-organic vapor phase epitaxy, the compositions are adjusted by controlling a process condition such as a flow rate of In-containing gas, a flow rate of Al-containing gas, or temperature.

A difference between the bandgap energy E(w) of the well layers 13 and the bandgap energy E(b) of the barrier layers 15, i.e., the energy gap difference Eg1 (Eg1=E(b)−E(w)) between the well layers 13 and the barrier layers 15 is not less than $2.4 \times 10^{-20}$ J (0.15 eV) nor more than $4.8 \times 10^{-20}$ J (0.3 eV). A conversion relation used herein is 1 eV=$1.602 \times 10^{-19}$ J. The bandgap energy E(w) is determined, for example, by adjusting values of In composition X1 and Al composition Y1. Where the In composition X1 is fixed, the bandgap energy E(w) increases with increase in the Al composition Y1. The bandgap energy E(b) is determined, for example, by adjusting values of In composition X2 and Al composition Y2. Where the In composition X2 is fixed, the bandgap energy E(b) increases with increase in the Al composition Y2. The active region 17 preferably has a quantum well structure in which a plurality of well layers 13 and a plurality of barrier layers 15 are alternately arranged. Each well layer 13 is located between barrier layers 15. The active region 17 is provided, for example, on a first conductivity type nitride semiconductor layer 25 provided on a support substrate 19. Preferably, a buffer layer 27 is located between the active region 17 and the first conductivity type nitride semiconductor layer 25. Preferably, a first conductivity type nitride semiconductor layer 23 is located between the support substrate 19 and the first conductivity type nitride semiconductor layer 25. Preferably, a nitride semiconductor layer 21 is located between the support substrate 19 and the first conductivity type nitride semiconductor layer 23.

Since in this nitride semiconductor light-emitting element 11 the energy gap difference Eg1 is not less than $2.4 \times 10^{-20}$ J, the carrier confinement effect of the active region 17 is exceptionally good.

When the bandgap energy E(w) of the well layers 13 is set at a certain value, the bandgap energy E(b) of the barrier layers 15 needs to be increased in order to increase the energy gap difference Eg1. In order to increase the bandgap energy E(b) of the barrier layers 15, it is necessary to increase the Al composition Y2 of the barrier layers 15. However, if the Al composition Y2 of the barrier layers 15 is too large, the crystal quality of the barrier layers 15 will tend to degrade. The cause for it is considered as follows.

In general, a low temperature, approximately 800° C., is preferable to form a nitride semiconductor layer containing In, with good crystal quality. This is because a high temperature causes such elimination of In that In cannot be taken into crystals. On the other hand, a high temperature of not less than 1000° C. is preferred in order to form a nitride semiconductor layer containing a large amount of Al, with good crystal quality. This is because migration of Al is more promoted at higher temperature. Since the barrier layers 15 contain In, they are preferably formed at a low temperature; however, since the barrier layers 15 also contain Al, the crystal quality of the barrier layers 15 tends to worsen with increase in the Al composition Y2.

Furthermore, since the InAlGaN layers are grown at lower temperatures than the AlGaN layers, oxygen readily comes to be mixed as an impurity in the InAlGaN layers. Therefore, the oxygen concentration is considered to increase with increase in the Al composition in the InAlGaN layers. For this reason, it is contemplated that an increase in the Al composition Y2 tends to degrade the crystal quality of the barrier layers 15 due to the increase in the oxygen concentration.

Consequently, when the energy gap difference Eg1 is too large, the crystal quality of the barrier layers 15 tends to degrade. Since in the nitride semiconductor light-emitting element 11 the energy gap difference Eg1 is not more than $4.8 \times 10^{-20}$ J, the crystal quality of the barrier layers 15 is exceptionally good. In this case, nonradiative recombination of carries can be suppressed in the active region 17.

It can be understood from the above that the luminous efficiency of the nitride semiconductor light-emitting element 11 is remarkably improved.

The support substrate 19 is comprised, for example, of a III-nitride such as GaN, sapphire, or the like. The nitride semiconductor layer 21 is comprised, for example, of a GaN semiconductor. The first conductivity type nitride semiconductor layer 23 is comprised, for example, of an n-type GaN semiconductor doped with Si or the like. The first conductivity type nitride semiconductor layer 25 is comprised, for example, of an n-type AlGaN semiconductor doped with Si or the like. The buffer layer 27 is preferably comprised of an $In_{X4}Al_{Y4}Ga_{1-X4-Y4}N$ semiconductor ($1>X4>0$ and $1>Y4>0$).

The In composition X1 of the well layers 13 is preferably more than 0 and less than 0.03 and more preferably not less than 0.01 nor more than 0.02. At a certain emission wavelength, an increase in the In composition X1 requires an increase in the Al composition Y1 for adjustment of wavelength. When the Al composition Y1 is too large, the crystal quality of the well layers 13 tends to degrade. Therefore, the In composition X1 is preferably set at a small value, in order to improve the crystal quality of the well layers 13. However, if the In composition is too small, the luminous efficiency will tend to decrease because of reduction in so-called In composition fluctuation effect, i.e., effect of improving the luminous efficiency by spontaneous inhomogeneity of In composition. This nitride semiconductor light-emitting element 11 is able to achieve the satisfactory crystal quality of the well layers 13 and the In composition fluctuation effect together because the In composition X1 of the well layers 13 is more than 0 and less than 0.03. For this reason, an improvement is made in the luminous efficiency of the nitride semiconductor light-emitting element 11.

When the In composition X1 of the well layers 13 is more than 0 and less than 0.03, surface roughness of the well layers 13 becomes lowered. This improves interface sharpness between the well layers 13 and the barrier layers 15 and thus improves the luminous efficiency of the nitride semiconductor light-emitting element 11.

Furthermore, in a case where the emission wavelength of the nitride semiconductor light-emitting element 11 is, for example, 350 nm and where the In composition X1 of the well layers 13 is more than 0 and less than 0.03, the Al composition Y1 of the well layers 13 is preferably more than 0.05 and less than 0.14.

The In composition X2 of the barrier layers 15 is preferably more than 0 and less than 0.03 and more preferably not less than 0.01 nor more than 0.02. The barrier layers 15 alternately grown with the well layers 13 are preferably grown at a relatively low temperature enough for In to be taken in, as the well layers 13 are. In that case, the crystal quality is more improved when the barrier layers 15 also contain a small amount of In. At a certain emission wavelength, an increase in the In composition X2 requires an increase in the Al composition Y2 for adjustment of wavelength. When the Al composition Y2 is too large, the crystal quality of the barrier layers 15 tends to degrade. Therefore, in order to improve the crystal quality of the barrier layers 15, it is preferable to set the In composition X2 at a small value. Since in the nitride semiconductor light-emitting element 11 the In composition X2 of the barrier layers 15 is less than 0.03, the crystal quality of the barrier layers 15 is excellent. For this reason, an improvement is made in the luminous efficiency of the nitride semiconductor light-emitting element 11.

When the In composition X2 of the barrier layers 15 is more than 0 and less than 0.03, surface roughness of the barrier layers 15 becomes lowered. This improves the interference sharpness between the well layers 13 and the barrier layers 15 and thus improves the luminous efficiency of the nitride semiconductor light-emitting element 11.

Furthermore, in a case where the emission wavelength of the nitride semiconductor light-emitting element 11 is, for example, 350 nm, where the energy gap difference Eg1 is $3.5 \times 10^{-20}$ J, and where the In composition X2 of the barrier layers 15 is more than 0 and less than 0.03, the Al composition Y2 of the barrier layers 15 is preferably more than 0.15 and less than 0.24.

The active region 17 preferably has the quantum well structure that generates light of wavelengths in the wavelength region of not less than 300 nm nor more than 365 nm. More preferably, the active region 17 has a multiquantum well structure (MQW). In this case, the nitride semiconductor light-emitting element 11 is able to generate light showing a photoluminescence spectrum having a peak wavelength in the wavelength region of not less than 300 nm nor more than 365 nm. In the active region 17 with the emission wavelength of not less than 300 nm, the crystal quality thereof is good.

Second Embodiment

Figure 2:
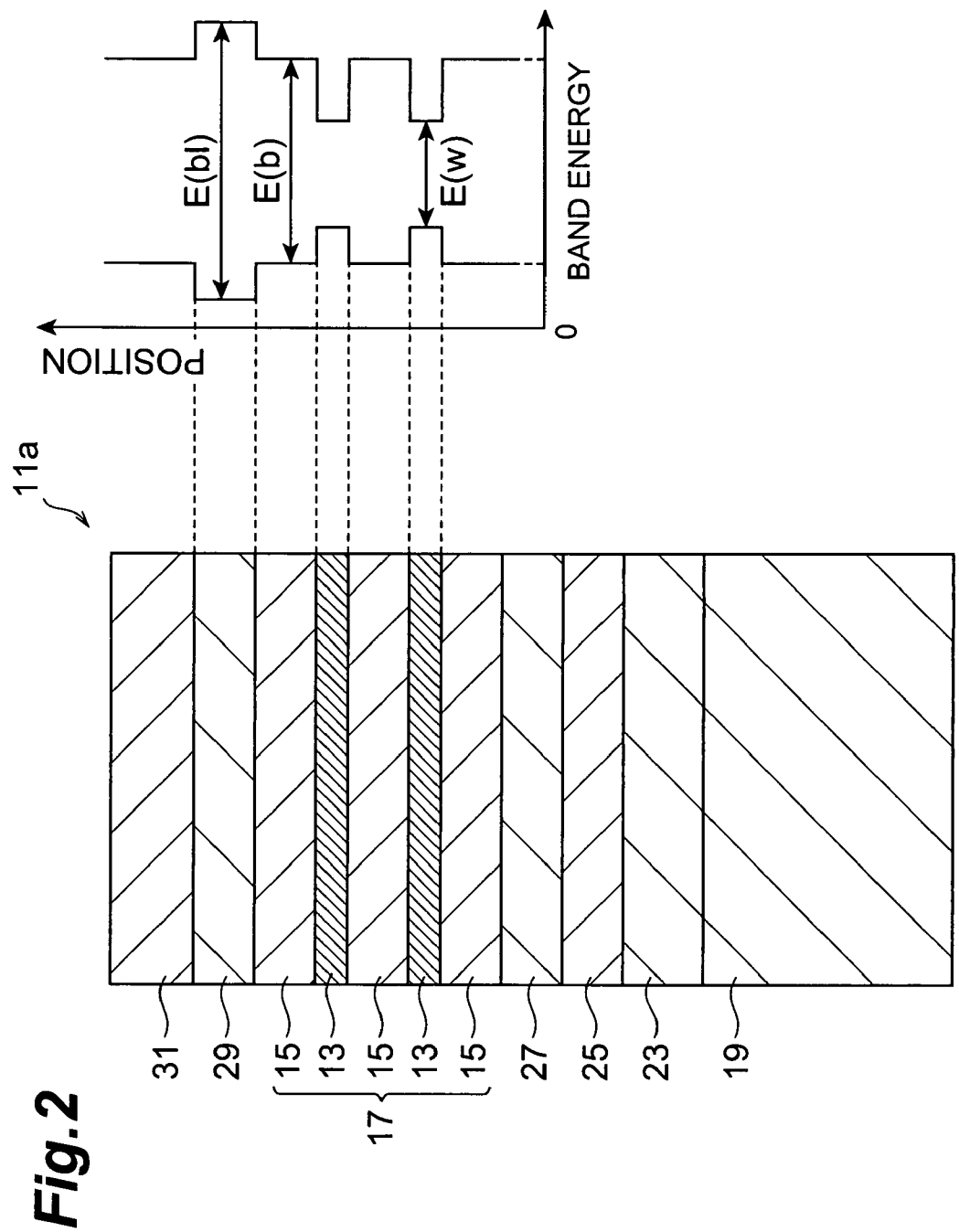
FIG. 2 is a sectional view schematically showing a nitride semiconductor light-emitting element according to a second embodiment.

FIG. 2 is a sectional view schematically showing a nitride semiconductor light-emitting element according to the second embodiment. FIG. 2 also shows a band diagram of the nitride semiconductor light-emitting element according to the second embodiment. The nitride semiconductor light-emitting element 11a shown in FIG. 2 generates light containing wavelength components in the ultraviolet region, for example, when an electric current is injected thereinto. The nitride semiconductor light-emitting element 11a has an active region 17 comprising of InAlGaN semiconductors, and an $In_{X3}Al_{Y3}Ga_{1-X3-Y3}N$ layer 29 (hereinafter referred to as "InAlGaN layer 29") provided on the active region 17. Here the In composition X3 and Al composition Y3 satisfy the following conditions: $1>X3\geq0$ and $1>Y3>0$. The In composition X3 and Al composition Y3 are adjusted when the InAlGaN layer 29 is formed; for example, when it is made by metal-organic vapor phase epitaxy, the compositions are adjusted by controlling a process condition such as a flow rate of In-containing gas, a flow rate of Al-containing gas, or temperature.

Since the nitride semiconductor light-emitting element 11a has the active region 17, the luminous efficiency of the nitride semiconductor light-emitting element 11a can be remarkably improved, as in the case of the nitride semiconductor light-emitting element 11.

A difference between the bandgap energy E(b1) of the InAlGaN layer 29 and the bandgap energy E(w), i.e., an energy gap difference Eg2 (Eg2=E(b1)−E(w)) between the InAlGaN layer 29 and the well layers 13 is preferably larger than the energy gap difference Eg1. The bandgap energy E(b1) is determined, for example, by adjusting values of In composition X3 and Al composition Y3. When the In composition X3 is fixed, the bandgap energy E(b1) increases with increase in the Al composition Y3. When the energy gap difference Eg2 is larger than the energy gap difference Eg1, overflow of carriers is prevented. The InAlGaN layer 29 preferably functions as an electron block layer. More preferably, the energy gap difference Eg2 is not less than $4.8 \times 10^{-20}$ J (0.3 eV).

The energy gap difference Eg2 is preferably not more than $7.2 \times 10^{-20}$ J (0.45 eV). When the bandgap energy E(w) of the well layers 13 is set at a certain value, the bandgap energy E(b1) of the InAlGaN layer 29 needs to be increased in order to increase the energy gap difference Eg2. In order to increase the bandgap energy E(b1) of the InAlGaN layer 29, it is necessary to increase the Al composition Y3 of the InAlGaN layer 29. However, if the Al composition Y3 is too large, the crystal quality of the InAlGaN layer 29 will tend to degrade. Therefore, when the energy gap difference Eg2 is too large, the crystal quality of the InAlGaN layer 29 tends to degrade. When the energy gap difference Eg2 is not more than $7.2 \times 10^{-20}$ J, the crystal quality of the InAlGaN layer 29 becomes exceptionally good.

The InAlGaN layer 29 may be comprised of a p-type semiconductor doped with Mg. In that case, an increase in the Al composition Y3 makes achievement of the p-type more difficult and decreases the hole carrier concentration, so that carrier overflow tends to occur. However, when the energy gap difference Eg2 is not more than $7.2 \times 10^{-20}$ J, the InAlGaN layer 29 has good p-type conductivity even in the case where the InAlGaN layer 29 is comprised of the p-type semiconductor doped with Mg.

The thickness of the InAlGaN layer 29 is preferably not less than 10 nm. In this case, overflow of carriers is prevented. Therefore, an improvement is made in the luminous efficiency of the nitride semiconductor light-emitting element 11a.

The thickness of the InAlGaN layer 29 is preferably not more than 30 nm. In this case, the carrier overflow preventing effect is achieved without degradation of the crystal quality of the InAlGaN layer 29. Therefore, an improvement is made in the luminous efficiency of the nitride semiconductor light-emitting element 11a.

In the nitride semiconductor light-emitting element 11a, the active region 17 is provided, for example, on a first conductivity type nitride semiconductor layer 25 provided on a support substrate 19. Preferably, a buffer layer 27 is located between the active region 17 and the first conductivity type nitride semiconductor layer 25. Preferably, a first conductivity type nitride semiconductor layer 23 is located between the support substrate 19 and the first conductivity type nitride semiconductor layer 25. Preferably, a second conductivity type nitride semiconductor layer 31 is provided on the InAlGaN layer 29. Preferably, a first electrode is provided on the second conductivity type nitride semiconductor layer 31. Preferably, a second electrode is provided on a back surface of the support substrate 19. The support substrate 19 is preferably located between the second electrode and the first conductivity type nitride semiconductor layer 23.

The InAlGaN layer 29 is preferably a nondoped $In_{X3}Al_{Y3}Ga_{1-X3-Y3}N$ layer or a second conductivity type $In_{X3}Al_{Y3}Ga_{1-X3-Y3}N$ layer. The InAlGaN layer 29 is comprised, for example, of a p-type $In_{X3}Al_{Y3}Ga_{1-X3-Y3}N$ semiconductor doped with Mg or the like, or a nondoped $In_{X3}Al_{Y3}Ga_{1-X3-Y3}N$ semiconductor. The second conductivity type nitride semiconductor layer 31 is comprised, for example, of a p-type AlGaN semiconductor doped with Mg or the like.

The above detailed the preferred embodiments of the present invention, but it is noted that the present invention is by no means limited to each of the above embodiments.

EXAMPLES

The present invention will be described below in more detail on the basis of examples and comparative examples, and it is noted that the present invention is by no means intended to be limited to the examples below.

Figure 3:
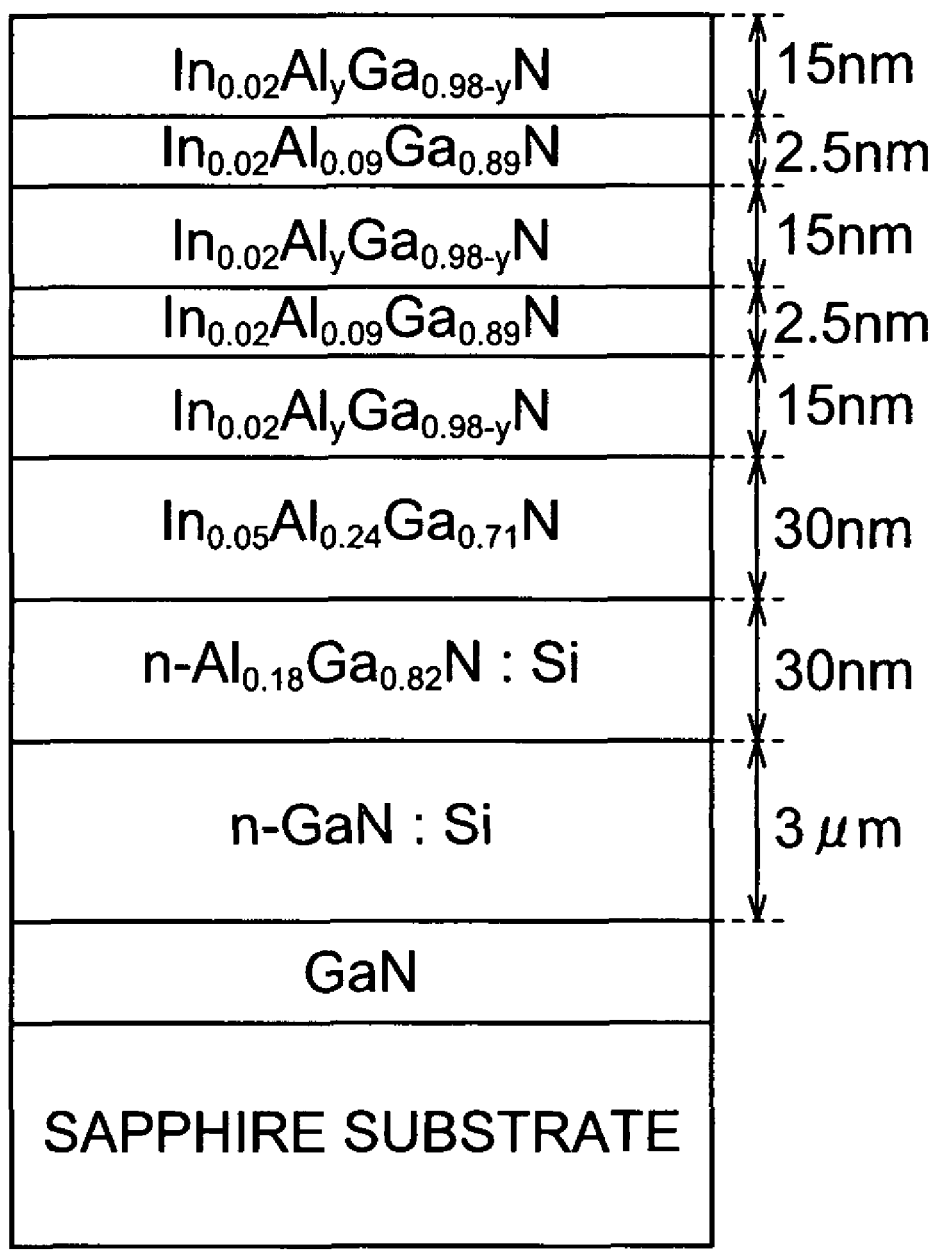
FIG. 3 is a drawing schematically showing a nitride semiconductor light-emitting element corresponding to the first embodiment.

FIG. 3 is a drawing schematically showing a nitride semiconductor light-emitting element corresponding to the first embodiment. In FIG. 3, y represents the Al composition of the barrier layers.

Example 1

The value of y was 0.19. Therefore, the nitride semiconductor light-emitting element of Example 1 has the following structure.

barrier layers 15: $In_{0.02}Al_{0.19}Ga_{0.79}N$ layers (thickness: 15 nm)
well layers 13: $In_{0.02}Al_{0.09}Ga_{0.89}N$ layers (thickness: 2.5 nm)
buffer layer 27: $In_{0.05}Al_{0.24}Ga_{0.71}N$ layer (thickness: 30 nm)
first conductivity type nitride semiconductor layer 25: Si-doped n-type $Al_{0.18}Ga_{0.82}N$ layer (thickness: 30 nm)
first conductivity type nitride semiconductor layer 23: Si-doped n-type GaN layer (thickness: 3 μm)
nitride semiconductor layer 21: GaN layer
support substrate 19: sapphire substrate The bandgap energy E(w) of the well layers is $5.67 \times 10^{-19}$ J (3.54 eV). The bandgap energy E(b) of the barrier layers is $6.02 \times 10^{-19}$ J (3.76 eV).

The nitride semiconductor light-emitting element of Example 1 was fabricated by the following method. First, the sapphire substrate was cleaned in a $H_2$ atmosphere and at 1100° C. Then the GaN buffer layer, Si-doped n-type GaN layer, and Si-doped n-type AlGaN layer were successively grown on the sapphire substrate. Furthermore, the InAlGaN layer was grown at 780° C. on the Si-doped n-type AlGaN layer. After that, 2-cycles of InAlGaN/InAlGaN-MQW was formed at 830° C. on the InAlGaN layer.

Comparative Example 1

The nitride semiconductor light-emitting element of Comparative Example 1 was fabricated in the same manner as in Example 1 except that the value of y was 0.15. Therefore, the barrier layers in the nitride semiconductor light-emitting element of Comparative Example 1 are $In_{0.02}Al_{0.15}Ga_{0.83}N$ layers (thickness: 15 nm). The bandgap energy of the barrier layers is $5.88 \times 10^{-19}$ J (3.67 eV).

Comparative Example 2

The nitride semiconductor light-emitting element of Comparative Example 2 was fabricated in the same manner as in Example 1 except that the value of y was 0.26. Therefore, the barrier layers in the nitride semiconductor light-emitting element of Comparative Example 2 are $In_{0.02}Al_{0.26}Ga_{0.72}N$ layers (thickness: 15 nm). The bandgap energy of the barrier layers is $6.20 \times 10^{-19}$ J (3.87 eV).

(Calculation Results of Energy Gap Differences)

The energy gap difference Eg1 was calculated for each of the nitride semiconductor light-emitting elements of Example 1, Comparative Example 1, and Comparative Example 2. The calculation results are presented in FIG. 4. FIG. 4 is a drawing showing the energy gap differences of the nitride semiconductor light-emitting elements of Example 1, Comparative Example 1, and Comparative Example 2.

(Measurement Results of Photoluminescence Intensities)

Figure 5:
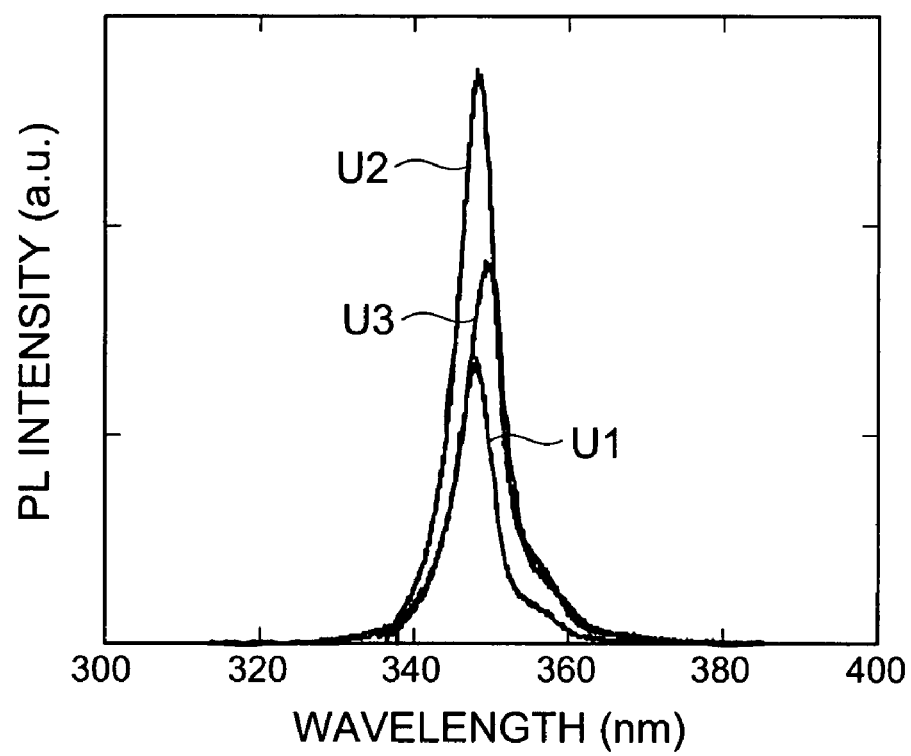
FIG. 5 is a graph showing photoluminescence spectra of respective nitride semiconductor light-emitting elements of Example 1, Comparative Example 1, and Comparative Example 2.

The photoluminescence intensities (PL intensities) were measured for each of the nitride semiconductor light-emitting elements of Example 1, Comparative Example 1, and Comparative Example 2. The measurement results are presented in FIG. 5. FIG. 5 is a graph showing photoluminescence spectra of the respective nitride semiconductor light-emitting elements of Example 1, Comparative Example 1, and Comparative Example 2. The horizontal axis indicates wavelength, and the vertical axis PL intensity. A photoluminescence spectrum U1 shown in FIG. 5 indicates the measurement result of the nitride semiconductor light-emitting element of Comparative Example 1. A photoluminescence spectrum U2 indicates the measurement result of the nitride semiconductor light-emitting element of Example 1. A photoluminescence spectrum U3 indicates the measurement result of the nitride semiconductor light-emitting element of Comparative Example 2.

As shown in FIG. 5, the peak intensity of the photoluminescence spectrum U2 is approximately double the peak intensity of the photoluminescence spectrum U1. The peak intensity of the photoluminescence spectrum U2 is approximately 1.5 times the peak intensity of the photoluminescence spectrum U3. It was thus confirmed that the luminous efficiency of the nitride semiconductor light-emitting element of Example 1 was higher than those of the nitride semiconductor light-emitting elements of Comparative Examples 1 and 2. A conceivable reason for it is that carriers are efficiently confined and the crystal quality of the barrier layers is excellent in the nitride semiconductor light-emitting element of Example 1. When the crystal quality of the barrier layers is excellent, nonradiative recombination of carriers is suppressed at the MQW interfaces or in the barrier layers.

Example 2

The nitride semiconductor light-emitting element of Example 2 was fabricated in the same manner as in Example 1 except that, while maintaining the energy gap difference Eg1 at $3.5 \times 10^{-20}$ J, the In composition X1 of the well layers 13 and the In composition X2 of the barrier layers 15 both were set to 0.06.

Comparative Example 3

The nitride semiconductor light-emitting element of Comparative Example 3 was fabricated in the same manner as in Example 1 except that, while maintaining the energy gap difference Eg1 at $3.5 \times 10^{-20}$ J, the In composition X1 of the well layers 13 and the In composition X2 of the barrier layers 15 both were set to 0.

(Measurement Results of Photoluminescence Intensities)

Figure 6:
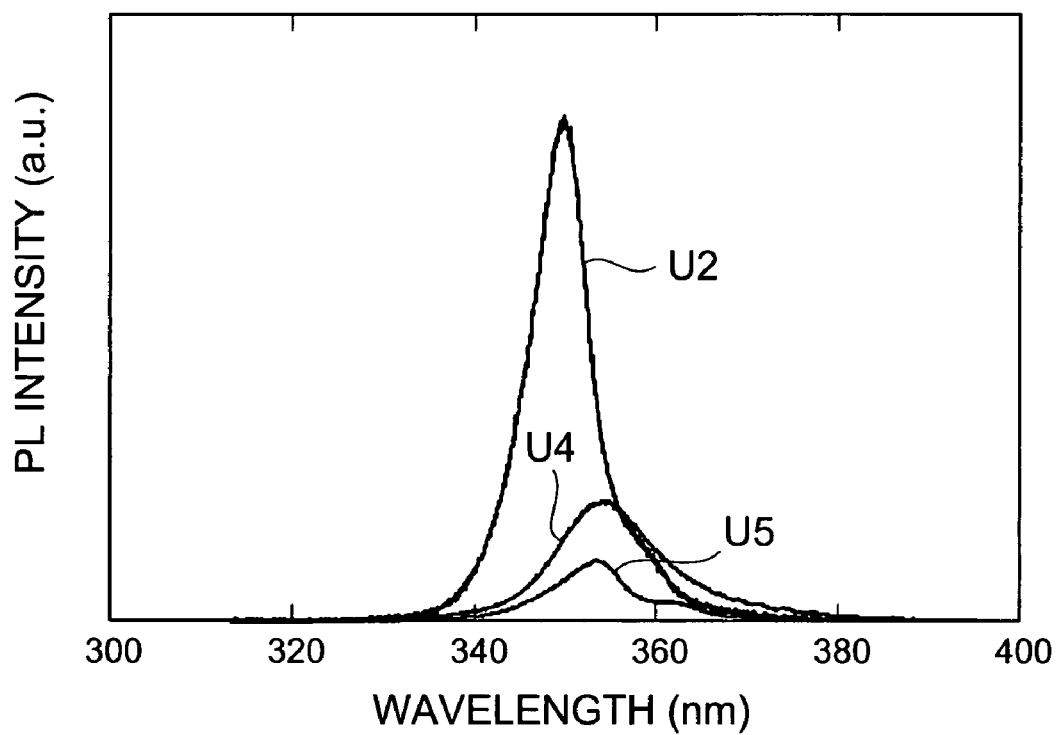
FIG. 6 is a graph showing photoluminescence spectra of respective nitride semiconductor light-emitting elements of Example 1, Example 2, and Comparative Example 3.

The photoluminescence intensities (PL Intensities) were measured for each of the nitride semiconductor light-emitting elements of Example 2 and Comparative Example 3. The measurement results are presented in FIG. 6. FIG. 6 is a graph showing the photoluminescence spectra of the respective nitride semiconductor light-emitting elements of Example 1, Example 2, and Comparative Example 3. The horizontal axis indicates wavelength and the vertical axis PL intensity. The photoluminescence spectrum U4 shown in FIG. 6 indicates the measurement result of the nitride semiconductor light-emitting element of Example 2. The photoluminescence spectrum U5 indicates the measurement result of the nitride semiconductor light-emitting element of Comparative Example 3. In FIG. 6, the PL intensities of the photoluminescence spectrum U5 are depicted with ten times measured values in comparison with the photoluminescence spectra U4, U5.

As shown in FIG. 6, the peak intensity of the photoluminescence spectrum U2 is approximately four times the peak intensity of the photoluminescence spectrum U4, and approximately 80 times the peak intensity of the photoluminescence spectrum U5. It is seen from this result that when the In compositions X1, X2 are larger than 0, the In composition fluctuation effect significantly increases the PL intensities and that when the In compositions X1, X2 are too large, the PL intensities are lowered. A conceivable reason for it is as follows: if the In compositions X1, X2 are too large, the Al compositions Y1, Y2 also need to be increased in order to maintain the energy gap difference Eg1, and it resulted in degrading crystallinity of the well layers and barrier layers. Another conceivable reason why the too large In compositions X1, X2 lower the PL intensities is that the increase of the Al compositions Y1, Y2 degrades flatness of surfaces so as to adversely affect sharpness of quantum well interfaces. When the Al compositions are lowered with In composition fluctuations being maintained, it is feasible to provide the active region with excellent crystallinity and excellent interface sharpness.

Figure 7:
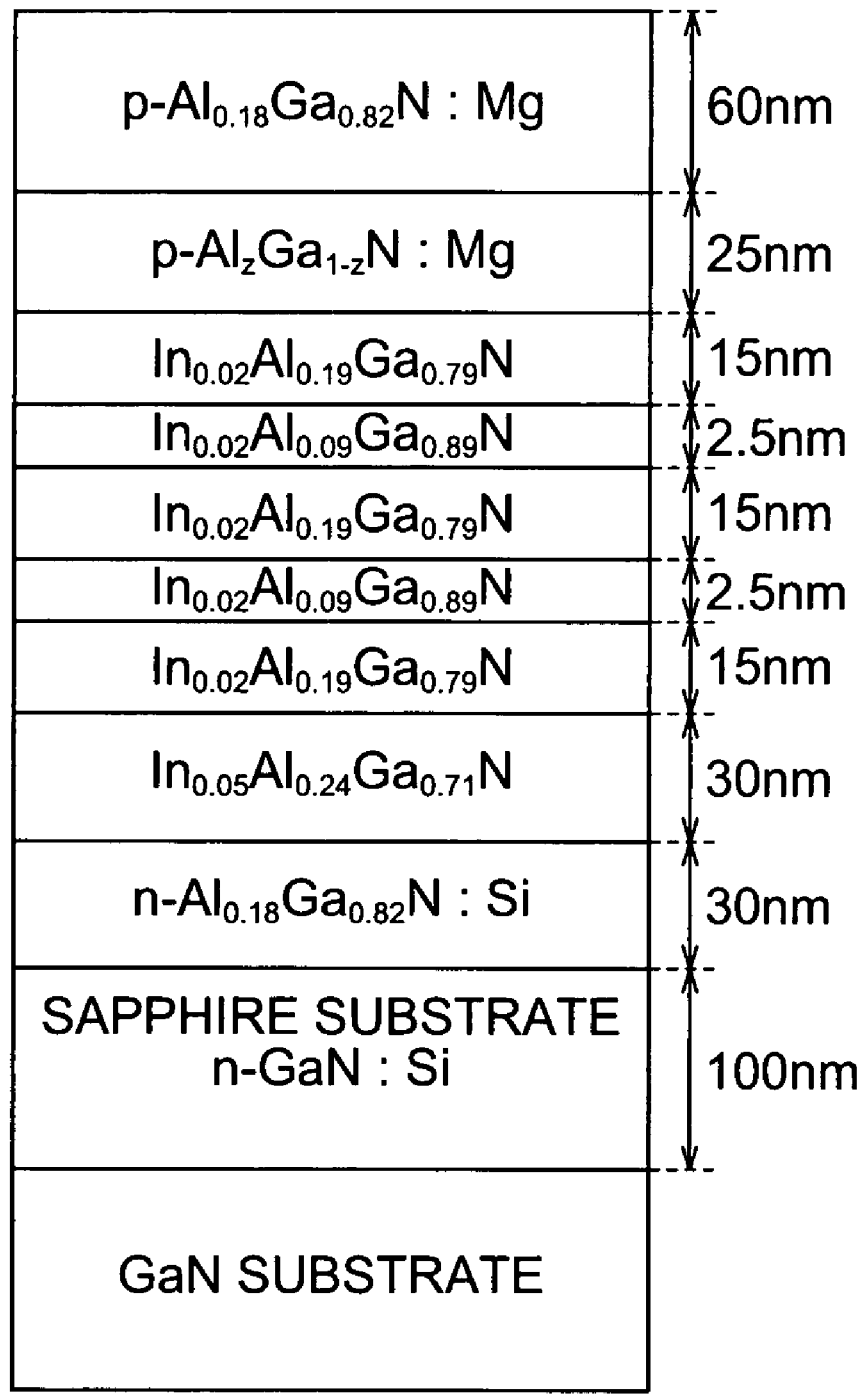
FIG. 7 is a drawing schematically showing a nitride semiconductor light-emitting element corresponding to the second embodiment.

FIG. 7 is a drawing schematically showing a nitride semiconductor light-emitting element corresponding to the second embodiment. In FIG. 7, z represents the Al composition of the electron block layer.

Example 3

The value of z was 0.18. Therefore, the nitride semiconductor light-emitting element of Example 3 has the following structure.
second conductivity type nitride semiconductor layer 31: Mg-doped p-type $Al_{0.18}Ga_{0.82}N$ layer (thickness: 60 nm)
InAlGaN layer 29: Mg-doped p-type $Al_{0.18}Ga_{0.82}N$ electron block layer (thickness: 25 nm)
barrier layers 15: $In_{0.02}Al_{0.9}Ga_{0.79}N$ layers (thickness: 15 nm)
well layers 13: $In_{0.02}Al_{0.09}Ga_{0.89}N$ layers (thickness: 2.5 nm)
buffer layer 27: $In_{0.05}Al_{0.24}Ga_{0.71}N$ layer (thickness: 30 nm)
first conductivity type nitride semiconductor layer 25: Si-doped n-type $Al_{0.18}Ga_{0.82}N$ layer (thickness: 30 nm)
first conductivity type nitride semiconductor layer 23: Si-doped n-type GaN layer (thickness: 100 nm)
support substrate 19: GaN substrate The bandgap energy E(w) of the well layers is $5.67 \times 10^{-19}$ J (3.54 eV). The bandgap energy E(b) of the barrier layers is $6.02 \times 10^{-19}$ J (3.76 eV). The bandgap energy E(b1) of the electron block layer is $6.04 \times 10^{-19}$ J (3.77 eV).

The nitride semiconductor light-emitting element of Example 3 was fabricated by the following method. First, the Si-doped n-type GaN layer and the Si-doped n-type AlGaN layer were successively grown at 1080° C. on the GaN layer of the GaN substrate. Furthermore, the InAlGaN layer was grown at 780° C. on the Si-doped n-type AlGaN layer. After that, 2 cycles of InAlGaN/InAlGaN-MQW was formed at 830° C. on the InAlGaN layer. Subsequently, the Mg-doped p-type AlGaN layer was formed on the MQW. Furthermore, an n-electrode of Ti/Al was formed on the back side of the GaN substrate, and a p-electrode of Ni/Au on the Mg-doped p-type AlGaN layer.

Example 4

The nitride semiconductor light-emitting element of Example 4 was fabricated in the same manner as in Example 3 except that the value of z was 0.24. Therefore, the electron block layer in the nitride semiconductor light-emitting element of Example 4 is an Mg-doped p-type $Al_{0.24}Ga_{0.76}N$ electron block layer (thickness: 25 nm). The bandgap energy E(b1) of the electron block layer is $6.20 \times 10^{-19}$ J (3.87 eV).

Example 5

The nitride semiconductor light-emitting element of Example 5 was fabricated in the same manner as in Example 3 except that the value of z was 0.27. Therefore, the electron block layer in the nitride semiconductor light-emitting element of Example 5 is an Mg-doped p-type $Al_{0.27}Ga_{0.73}N$ electron block layer (thickness: 25 nm). The bandgap energy E(b1) of the electron block layer is $6.31 \times 10^{-19}$ J (3.94 eV).

Example 6

The nitride semiconductor light-emitting element of Example 6 was fabricated in the same manner as in Example 3 except that the value of z was 0.30. Therefore, the electron block layer in the nitride semiconductor light-emitting element of Example 6 is an Mg-doped p-type $Al_{0.30}Ga_{0.70}N$ electron block layer (thickness: 25 nm). The bandgap energy E(b1) of the electron block layer is $6.4 \times 10^{-19}$ J (4.00 eV).

(Calculation Results of Energy Gap Differences)

The energy gap differences Eg1, Eg2 were calculated for each of the nitride semiconductor light-emitting elements of Example 3, Example 4, Example 5, and Example 6. The energy gap difference Eg1 was $3.5 \times 10^{-20}$ J (0.22 eV) in all the elements. The calculation results of the energy gap difference Eg2 are presented in FIG. 8. FIG. 8 is a drawing showing the energy gap differences of the respective nitride semiconductor light-emitting elements of Example 3, Example 4, Example 5, and Example 6.

(Measurement Results of Emission Intensities)

Figure 9:
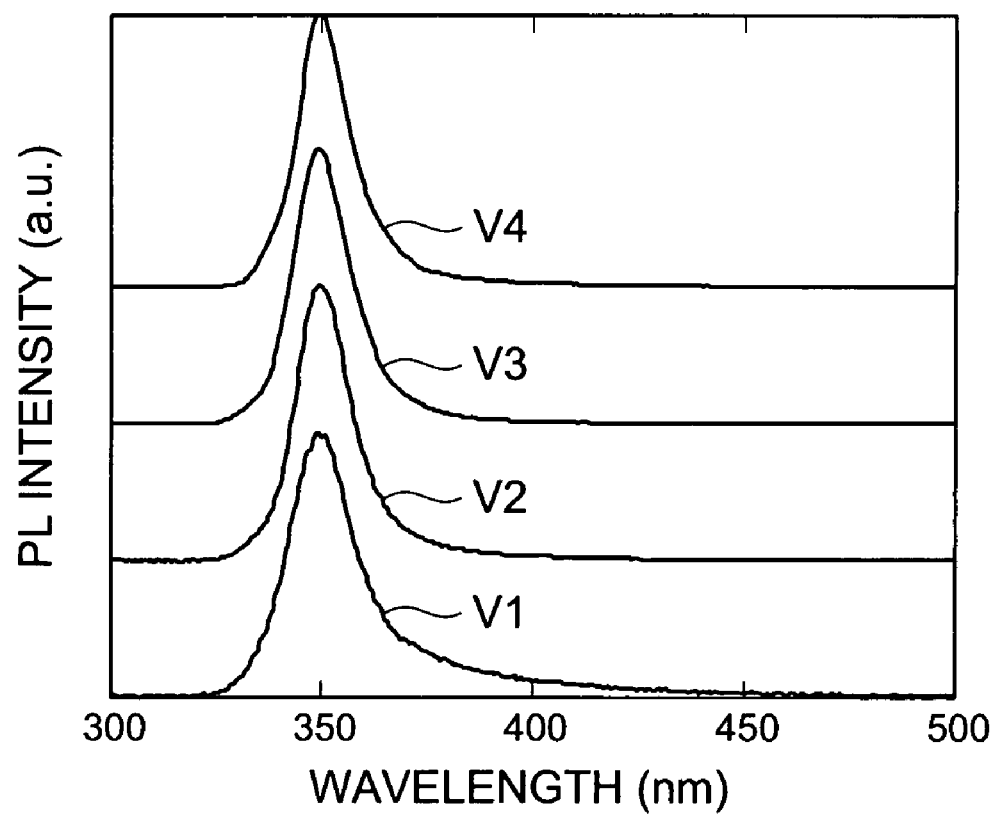
FIG. 9 is a graph showing emission spectra of respective nitride semiconductor light-emitting elements of Example 3, Example 4, Example 5, and Example 6.

The emission intensities (electroluminescence intensities) were measured for each of the nitride semiconductor light-emitting elements of Example 3, Example 4, Example 5, and Example 6. The measurement results are presented in FIG. 9. FIG. 9 is a graph showing the emission spectra of the respective nitride semiconductor light-emitting elements of Example 3, Example 4, Example 5, and Example 6. The horizontal axis indicates wavelength and the vertical axis emission intensity. The emission spectrum V1 shown in FIG. 9 indicates the measurement result of the nitride semiconductor light-emitting element of Example 3. The emission spectrum V2 indicates the measurement result of the nitride semiconductor light-emitting element of Example 4. The emission spectrum V3 indicates the measurement result of the nitride semiconductor light-emitting element of Example 5. The emission spectrum V4 indicates the measurement result of the nitride semiconductor light-emitting element of Example 6.

As shown in FIG. 9, the emission spectrum V1 had a tail on the long wavelength side of the peak wavelength, and the emission spectra V2, V3, and V4 had a single peak. It was confirmed that carrier overflow was more suppressed in the emission spectra V2, V3, and V4 than in the emission spectrum V1. The peak intensity of the emission spectrum V2 was approximately five times the peak intensity of the emission spectrum V1. The peak intensity of the emission spectrum V3 was approximately 2.5 times the peak intensity of the emission spectrum V2. The peak intensity of the emission spectrum V4 was approximately one third of the peak intensity of the emission spectrum V3. It was thus confirmed that as the energy gap difference Eg2 became larger, the emission spectrum came to have a single peak and the emission intensity increased and that when the energy gap difference Eg2 was too large, the emission intensity decreased.

(Evaluation of Surface Roughness of Well Layers)

Evaluation elements having the layer structure described below were fabricated and surfaces of the evaluation elements (surfaces of the well layers) were observed with an atomic force microscope (AFM). The surface roughness evaluation of the well layers was carried out using root-mean-square roughness Rq (also called RMS)

well layers 13: $In_{X1}Al_{Y1}Ga_{1-X1-Y1}N$ layers (thickness: 60 nm)

first conductivity type nitride semiconductor layer 23: Si-doped n-type GaN layer (thickness: 3 μm)

nitride semiconductor layer 21: GaN layer support substrate 19: sapphire substrate In the fabrication of evaluation elements, while the bandgap energy E(w) of the well layers was maintained at $5.67 \times 10^{-19}$ J, the In composition X1 was altered among 0.01, 0.02, and 0.04. When the In composition X1 was 0.01, the growth temperature of the well layers was 850° C. When the In composition X1 was 0.02, the growth temperature of the well layers was 830° C. When the In composition X1 was 0.04, the growth temperature of the well layers was 800° C.

Figure 10:
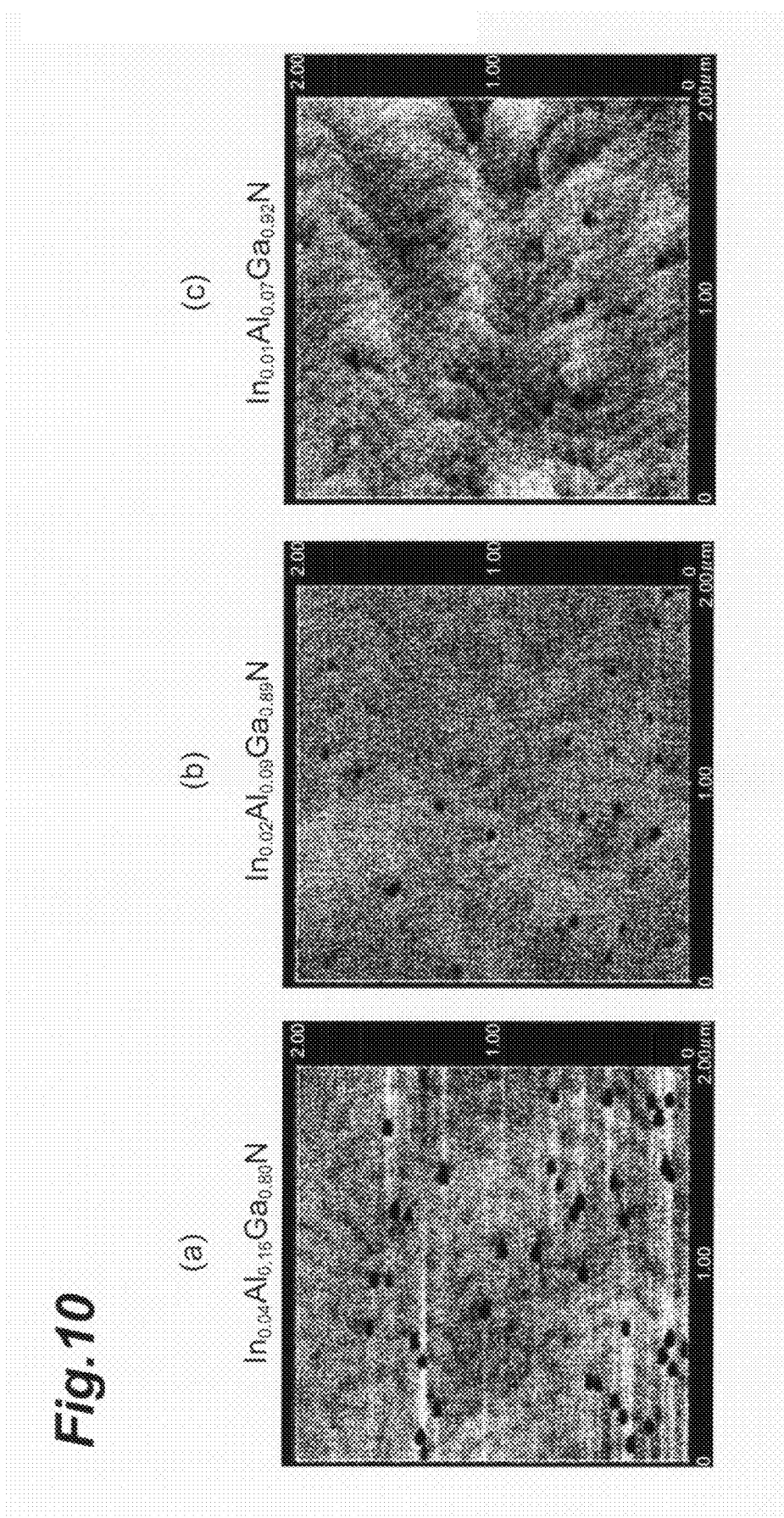
FIG. 10 is a drawing showing images acquired by observing surfaces of well layers with AFM.

FIG. 10 is a drawing showing images acquired by observing the surfaces of the well layers with AFM. FIG. 10(a) shows an AFM image in the case where the In composition X1 is 0.04. When the In composition X1 was 0.04, the root-mean-square roughness Rq was 1.76 nm. FIG. 10(b) shows an AFM image in the case where the In composition X1 is 0.02. When the In composition X1 was 0.02, the root-mean-square roughness Rq was 0.45 nm. FIG. 10(c) shows an AFM image in the case where the In composition X1 is 0.01. When the In composition X1 was 0.01, the root-mean-square roughness Rq was 0.40 nm.

The results of the surface roughness evaluation proved that the surface roughness became lowered with decrease in the In composition X1.

(Surface Roughness Evaluation of Barrier Layers)

Evaluation elements having the layer structure described below were fabricated in the same manner as in the case of the surface roughness evaluation of the well layers, and surfaces of the evaluation elements (surfaces of the barrier layers) were observed with an atomic force microscope (AFM). The surface roughness evaluation of the barrier layers was carried out using the root-mean-square roughness Rq.

barrier layers 15: $In_{X2}Al_{Y2}Ga_{1-X2-Y2}N$ layers (thickness: 60 nm)

first conductivity type nitride semiconductor layer 23: Si-doped n-type GaN layer (thickness: 3 μm)

nitride semiconductor layer 21: GaN layer support substrate 19: sapphire substrate In the fabrication of evaluation elements, while the bandgap energy E(b) of the barrier layers was maintained at $6.02 \times 10^{-19}$ J, the In composition X2 was altered among 0.01, 0.02, and 0.04.

Figure 11:
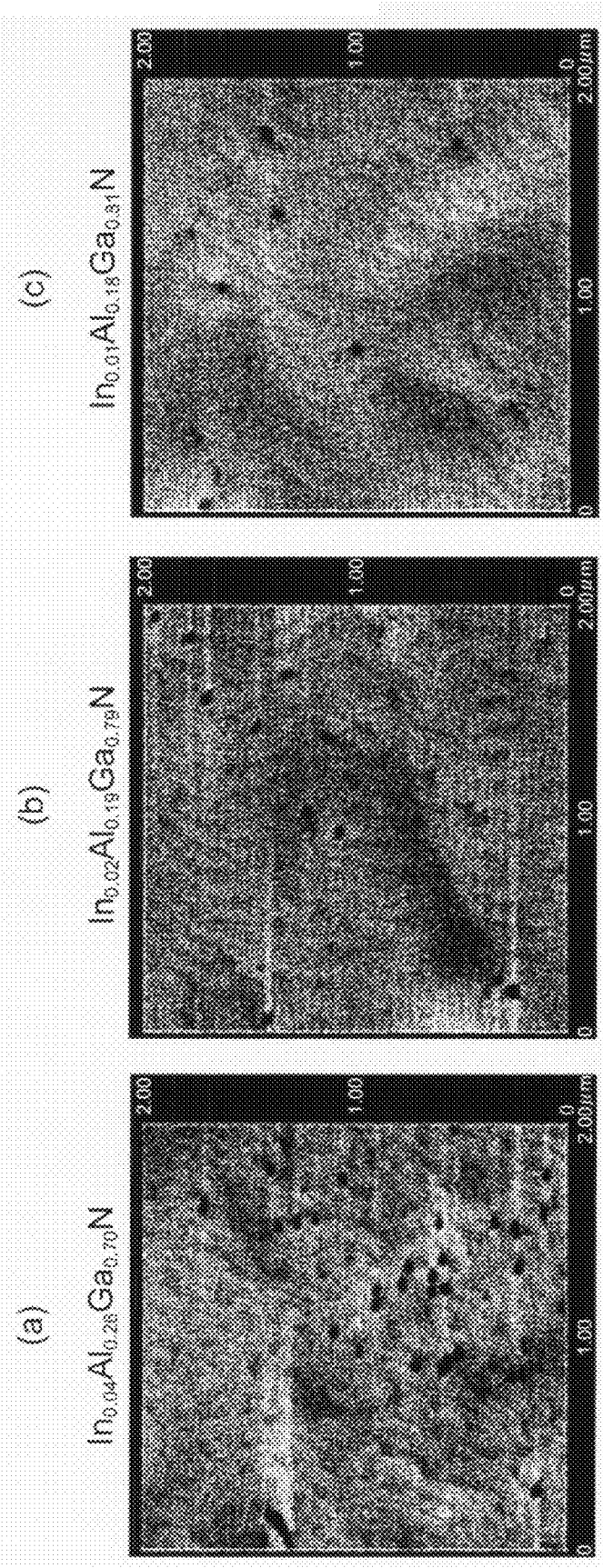
FIG. 11 is a drawing showing images acquired by observing surfaces of barrier layers with AFM.

FIG. 11 is a drawing showing images acquired by observing surfaces of the barrier layers with AFM. FIG. 11(a) shows an AFM image in the case where the In composition X2 is 0.04. When the In composition X2 was 0.04, the root-mean-square roughness Rq was 0.85 nm. FIG. 11(b) shows an AFM image in the case where the In composition X2 is 0.02. When the In composition X2 was 0.02, the root-mean-square roughness Rq was 0.49 nm. FIG. 11(c) shows an AFM image in the case where the In composition X2 is 0.01. When the In composition X2 was 0.01, the root-mean-square roughness Rq was 0.33 nm.

The results of the surface roughness evaluation proved that the surface roughness became lowered with decrease in the In composition X2.

The invention claimed is:

1. A nitride semiconductor light-emitting element for generating light containing a wavelength component in an ultraviolet region, comprising:

an active region comprising an $In_{X1}Al_{Y1}Ga_{1-X1-Y1}N$ well layer (1>X1>0 and 1>Y1>0) and an $In_{X2}Al_{Y2}Ga_{1-X2-Y2}N$ barrier layer (1>X2>0 and 1>Y2>0), wherein an energy gap difference between the $In_{X1}Al_{Y1}Ga_{1-X1-Y1}N$ well layer and the $In_{X2}Al_{Y2}Ga_{1-X2-Y2}N$ barrier layer is not less than $2.4 \times 10^{-20}$ J nor more than $4.8 \times 10^{-20}$ J, an In composition X1 of the $In_{X1}Al_{Y1}Ga_{1-X1-Y1}N$ well layer is more than 0 and less than or equal to 0.02, an In composition X2 of the $In_{X2}Al_{Y2}Ga_{1-X2-Y2}N$ barrier layer is more than 0 and less than or equal to 0.02, and the active region has a quantum well structure configured to generate light of a wavelength in a wavelength region of not less than 300 nm nor more than 365 nm.

2. The nitride semiconductor light-emitting element according to claim 1, further comprising an $In_{X3}Al_{Y3}Ga_{1-X3-Y3}N$ layer (1>X3≧0 and 1>Y3>0) provided on the active region, wherein an energy gap difference between the $In_{X3}Al_{Y3}Ga_{1-X3-Y3}N$ layer and the $In_{X1}Al_{Y1}Ga_{1-X1-Y1}N$ well layer is larger than the energy gap difference between the $In_{X1}Al_{Y1}Ga_{1-X1-Y1}N$ well layer and the $In_{X2}Al_{Y2}Ga_{1-X2-Y2}N$ barrier layer, and wherein the energy gap difference between the $In_{X3}Al_{Y3}Ga_{1-X3-Y3}N$ layer and the $In_{X1}Al_{Y1}Ga_{1-X1-Y1}N$ well layer is not more than $7.2 \times 10^{-20}$ J.

3. The nitride semiconductor light-emitting element according to claim 2, wherein a thickness of the $In_{X3}Al_{Y3}Ga_{1-X3-Y3}N$ layer is not less than 10 nm, and wherein the thickness of the $In_{X3}Al_{Y3}Ga_{1-X3-Y3}N$ layer is not more than 30 nm.

4. The nitride semiconductor light-emitting element according to claim 1, wherein:

the In composition X1 of the $In_{X1}Al_{Y1}Ga_{1-X1-Y1}N$ well layer is more than 0.01 and less than or equal to 0.02, and the In composition X2 of the $In_{X2}Al_{Y2}Ga_{1-X2-Y2}N$ barrier layer is more than 0.01 and less than or equal to 0.02.

* * * * *